United States Patent [19]

Renggli et al.

[11] Patent Number: 4,942,310
[45] Date of Patent: Jul. 17, 1990

[54] ARRANGEMENT FOR THE TRANSFORMATION OF AN ELECTRICAL MULTIPHASE SIGNAL INTO A FREQUENCY

[75] Inventors: Franz Renggli, Buchrain; Andreas Joder, Unterägeri, both of Switzerland

[73] Assignee: LGZ Landis & Gyr Zug AG, Zug, Switzerland

[21] Appl. No.: 325,135

[22] Filed: Mar. 17, 1989

[51] Int. Cl.$^5$ .................... H03L 7/00; H03K 5/22
[52] U.S. Cl. .................... 307/271; 307/511; 307/219.1; 328/109; 328/155; 328/134
[58] Field of Search ........... 307/262, 513, 511, 271, 307/519, 236, 219.1; 328/109, 133, 55, 155, 134, 150, 15

[56] References Cited

U.S. PATENT DOCUMENTS

| | | | |
|---|---|---|---|
| 3,602,824 | 8/1971 | Rusch et al. | 307/271 |
| 4,124,821 | 11/1978 | Petr | 328/151 |
| 4,128,848 | 12/1978 | Nakagawa | 307/262 |
| 4,829,257 | 5/1989 | Cooper | 307/262 |
| 4,868,428 | 9/1989 | Cooper | 307/271 |

FOREIGN PATENT DOCUMENTS 2951627 7/1981 Fed. Rep. of Germany.

Primary Examiner—Stanley D. Miller
Assistant Examiner—Richard Roseen
Attorney, Agent, or Firm—Marmorek, Guttman & Rubenstein

[57] ABSTRACT

An arrangement for converting a multiphase electric signal into a frequency is disclosed. Illustratively, the arrangement comprises an adder circuit for adding the individual phases comprising said multiphase signal. The arrangement also comprises one first polarity reversing switch for each phase in the multiphase signal. A voltage/current converter is connected downstream of the first polarity reversing switches. At least one second polarity reversing switch is connected downstream of the voltage/current converter. A control circuit generates a periodic switch-over signal for controlling the first and second polarity reversing switches. In addition, a constant current source is connected to an input of the second polarity reversing switch.

4 Claims, 3 Drawing Sheets

ARRANGEMENT FOR THE TRANSFORMATION OF AN ELECTRICAL MULTIPHASE SIGNAL INTO A FREQUENCY

FIELD OF THE INVENTION

The instant invention relates to an arrangement for the conversion of an electrical multiphase signal into a frequency.

BACKGROUND OF THE INVENTION

Such arrangements are used for measuring purposes and find their application in such devices as multiphase electricity meters for the exact conversion of a multiphase output into a frequency which is proportional to the sum of outputs.

A multiphase signal $u_{H,1}$; $u_{H,2}$; $u_{H,3}$ comprises either measuring signals, e.g. electric voltages or currents, or signals which are derived from measuring signals such as electrical outputs which are known to be equal to the product of a currant and a voltage.

The structure and functioning of an arrangement of the kind mentioned above for a single-phase signal is known from U.S. Pat. No. 41 24 821. In that patent the principle of periodic polarity reversal is used for the elimination of an offset voltage which as a rule affects the precision of measurement as a linear error in the form of a part of an input signal which cannot be compensated and is time or temperature dependent. Here the signal to be converted as well as the direction of transmission of the arrangement are polarity reversed periodically and simultaneously so that the two polarity sign changes of the signal to be converted cancel each other out. The influence of the offset voltage on the other hand, which is subjected only to the polarity sign change of the transmission direction, is alternately added to or subtracted from the signal during each half-period of a switch-over signal so that the integration of the offset voltage over a whole number of periods of the switch-over signal results in the value zero, on condition that both half periods of the switch-over signal are of exactly the same length. Since a residual charge which is other than zero is still present as a rule in an integration capacitor at the moment of polarity reversal, the residual charge becomes effective after the polarity reversal by causing an erroneous polarity and causing the wrong measuring result to be obtained. Considered over a longer measuring period, this error need not exert a negative influence on the median value of the impulse frequency, but it leads to a momentary variation in any case, i.e. to a modulation of the impulse frequency. To avoid this, the state of the art provides for the synchronization of the polarity reversal with the output signal of a comparator which monitors the capacitor voltage so that the polarity reversal always occurs at the crossover of the capacitor voltage, i.e. at the instant when the residual charge of the capacitor is zero. However this solution causes the two half-periods of the switch-over signal to not always be exactly equal but, on a statistical average, to be of equal duration and thus to lead again to an irregular modulation of the output frequency of the arrangement which complicates the latter's calibration which is possible only after an unduly long period of time.

It is the object of the instant invention to improve the known arrangement in such manner that it can be used for a multiphase signal in a manner which avoids the modulation of the output frequency of the arrangement by unequal half-periods of the switch-over signal as well as modulation by residual capacitor charges which are still present at the instant of polarity reversal so that rapid and exact calibration of the equipment, without long waiting periods is thus made possible.

SUMMARY OF THE INVENTION

The present invention is an arrangement for converting a multiphase electric signal into a frequency. Illustratively, the arrangement comprises an adder circuit for adding the individual phases comprising the multiphase signal. The arrangement also comprises one first polarity reversing switch for each phase in the multiphase signal A voltage/current converter is connected downstream of the first polarity reversing switches. At least one second polarity reversing switch is connected downstream of the voltage/current converter. A control circuit generates a periodic switch-over signal for controlling the first and second polarity reversing switches In addition, a constant current source is connected at an input of the second polarity reversing switch.

BRIEF DESCRIPTION OF THE DRAWING

Identical reference numbers designate identical parts in all figures of the drawing.

DETAILED DESCRIPTION OF THE INVENTION

Figure 1:
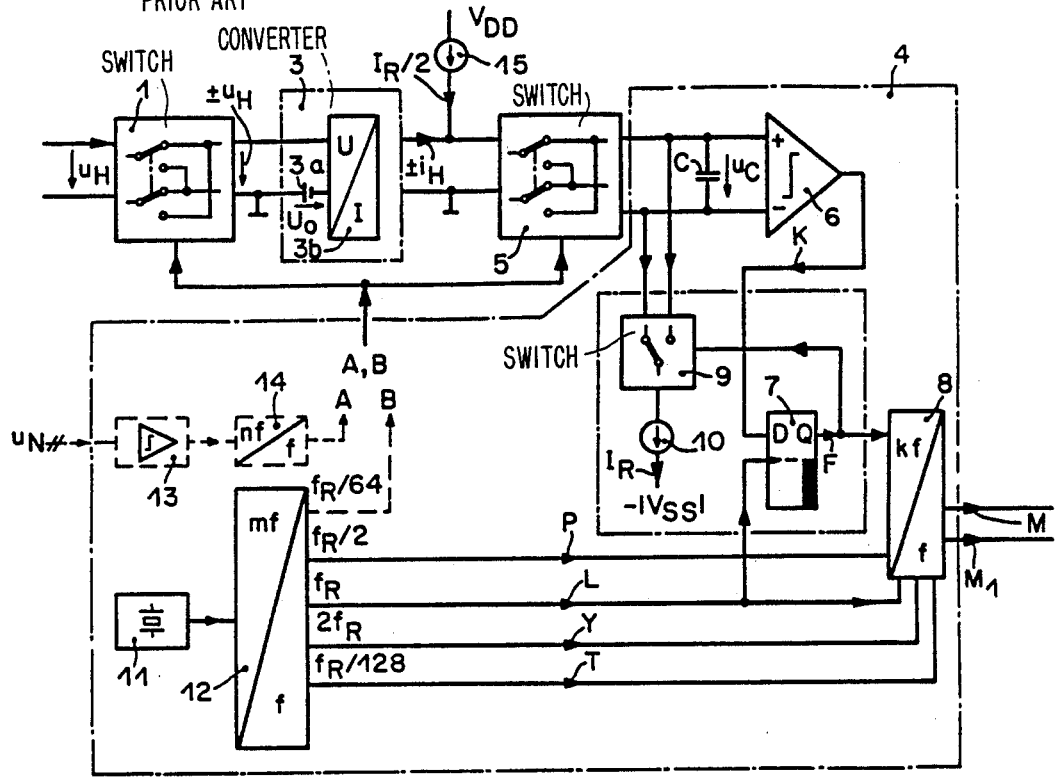
FIG. 1 shows a block diagram of an arrangement for converting a single-phase signal into a frequency.

All the components of the arrangement described can be assembled according to CMOS technology and are supplied by a positive DC supply voltage $V_{DD}$ and by a negative DC supply voltage $-V_{SS}$, both of which use ground as a potential reference. The two DC supply voltages can be derived by means of a rectifier in a known manner from a network alternating voltage $u_N$. In the drawing the rectifier and its connections have not been shown for reasons of greater clarity.

In the drawing all the optional connections and components are shown by broken lines. Clocking inputs which are controlled by means of negative voltage transitions (i.e. trailing edges) are provided symbolically with a black triangle.

The arrangement shown in FIG. 1 (prior art) comprises, in the sequence indicated, of a series connection of a first polarity reversing switch 1, a voltage/current converter 3, a second polarity reversing switch 5 and a circuit 4. The circuit 4 comprises in turn a capacitor C, a comparator 6, a D-flipflop 7, an output frequency divider 8, a switch 9, a constant-current source 10, a pulse generator 11, a pulse frequency divider 12, an optional comparator 13 and an optional switch-over frequency divider 14. Furthermore an additional source 15 of constant current is used as a signal source, the first pole of which is connected to a non-grounded output pole of the voltage/current converter 3 while its second pole is connected to the positive DC supply voltage $V_{DD}$. The inputs and outputs of the polarity reversing switches 1 and 5 as well as of the voltage/current converter 3 are bipolar, with one input pole of the voltage/current converter 3 and one of the input poles of the switch 5 being grounded. Within the circuit 4, its bipolar input is connected to the capacitor C whose first pole is in addition connected to a non-inverting input of the comparator 6 and, via a normally opened contact of the switch 9, to a first pole of the source 10 of constant current, while its second pole is in addition connected to an inverting input of the comparator 6 and, via a normally closed contact of the switch 9, to the first pole of the source 1? of constant current whose second pole is connected to the negative DC supply voltage $-V_{SS}$. The output of the comparator 6 is connected to a D-input of the D-flipflop 7 whose Q-output is connected on the one hand to a control input of the switch 9 and on the other hand to a first signal input of the output frequency divider 8.

The output of the pulse generator 11 is connected to the input of the pulse frequency divider 12 which can have five outputs, for example. Its first output, at which a clocking signal P of the frequency $f_R/2$ appears, is connected to a second signal input of the output frequency divider 8, its second output at which a clocking signal L of the frequency $f_R$ appears is connected to a clocking input of the D-flipflop 7 and to a first clocking input of the output frequency divider 8 while its third output, at which a clocking signal T of frequency $f_R/128$ appears is connected to a second clocking input of the output frequency divider 8. Its fourth output, at which a clocking signal Y of the frequency $2f_R$ appears, is connected to a third clocking input of the output frequency divider 8.

An AC voltage $u_N$, e.g. a 50-Hz or 60-Hz AC power supply voltage, optionally supplies, via two poles, the input of the comparator 13 whose output is connected to the input of the switch-over frequency divider 14. The interconnected control inputs of the polarity reversing switches 1 and 5 are supplied with a switch-over signal A from the output of the switch-over frequency divider 14 or with a switch-over signal B from the fifth output of the pulse frequency divider 12 via a wire connection. If the switch-over signal B is used, the comparator 13 and the frequency divider 14 can of course be omitted. The output frequency divider 8 can have two outputs for instance which are at the same time the outputs of the circuit 4 and at which the two signals M and $M_1$ appear. The signal M can represent a positive value and the signal $M_1$ a negative value of the signal $u_H$ for instance, which appears at the input of the polarity reversing switch 1.

The polarity reversing switches 1 and 5 are of identical construction, each comprising a bi-polar reversing switch which can be made with known semiconductor analog switches of the CMOS technology, for example. Each of the switches 1 and 5 can assume two states. In a first state (see the blocks 1 and 5 of FIG. 1) the first input pole is connected by the switch contacts to the first output pole and the second input pole is connected to the second output pole. In a second state, the first input pole is connected by the switch contacts to the second output pole and the second input pole is connected to the first output pole. The switch 9 has one pole and can also be made by means of the known semiconductor analog switches of CMOS.

The pulse frequency divider 12 and the switch-over frequency divider 14 can be made by means of the known binary counters of CMOS technology which make it possible to obtain synchronous frequency division by a number $2^x$, where x is a whole number.

The impulse generator 11 can be quartz-stabilized and produces rectangular clocking impulses, e.g. of frequency $2^{15} = 32.768$ kHz. This frequency is divided by m for example by the downstream pulse frequency divider 12, where m has the values $2^4$, $2^5$, $2^6$, $2^{11}$ and $2^{12}$, to produce the frequencies $2f_R = 2^{11}$ Hz of the clocking signal Y, $f_R = 2^{10}$ Hz of the clocking signal L, $f_R/2 = 2^9$ Hz of the clocking signal P, $f_R/64 = 2^4$ Hz = 16 Hz of the switch-over signal B and $f_R/128 = 2^3$ Hz of the clocking signal T.

The AC control voltage $u_N$ is converted in the comparator 13 into a periodic rectangular impulse signal of the same frequency. The switching threshold of the comparator 13 is preferably selected so that the polarity reversal in the downstream frequency divider 14 occurs precisely at the crossovers of the AC control voltage $u_N$. In the downstream switch-over frequency divider 14 the 50-Hz or 60-Hz of this rectangular impulse signal is divided by n, where n can have the value $2^2$ for example, to produce a frequency of 12.5 Hz or 15 Hz of the switch-over signal A. The switches 1 and 5 are thus reversed synchronously and periodically with the frequency 12.5 Hz or 15 Hz (switch-over signal A) or with the frequency 16 Hz (switch-over signal B) by the same switch-over signal A or B. The comparator 13 and the switch-over frequency divider 14 or the pulse generator 11 and in part the pulse frequency divider 12 thus constitute together a control circuit to produce the periodic switch-over signals A or B for the switches 1 and 5.

Figure 2:
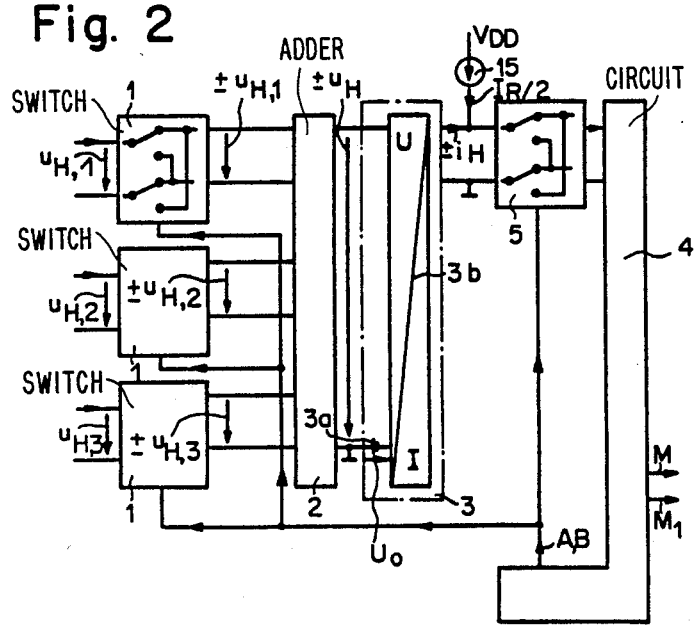
FIG. 2 shows a block diagram of a first embodiment of the arrangement according to the invention for converting a multiphase signal into a frequency.

The voltage/current converter 3 has in practice an unavoidable zero voltage (offset voltage) $U_o$, which is shown symbolically in FIGS. 1 and 2 by a voltage source 3a connected in series with an input pole of an ideal voltage/current converter 3b without offset voltage. The voltage source 3a and the ideal voltage/current converter 3b without offset voltage together constitute the non-ideal voltage/current converter 3.

The D-flipflop 7 can be controlled by means of negative transitions (i.e. trailing edges).

A signal $u_H$ in form of an electric voltage is directed via two poles to the inputs of the switch 1. If an electricity meter is used, $u_H$ is proportional to $u_N \cdot i_L$ and can be produced by means of a hall element (not shown), whereby $u_N$ is the power supply voltage of a utility power supply and $i_L$ is a load current, the magnetic field of which is measured by the Hall element while the supply current of the Hall element is produced proportionally by the power supply voltage $u_N$. The switch 1 reverses the polarity of signal $u_H$ periodically. During all odd-numbered half periods of the switch-over signal A for example, the signal $+u_H$ appears at the output of the switch 1 and during all the even-numbered half periods it is the signal $-u_H$.

The periodically polarity reversed signal $(+/-)u_H$ is converted in the downstream voltage/current converter 3 into a proportional current $(+/-)i_H$. Following this voltage/current conversion and before a subsequent integration a DC current $I_R/2$ is added at the output of the voltage/current converter 3 as a constant reference signal to the current signal $(+/-)i_H$ produced by the voltage/current converter 3 in order to provide a compound signal $(+/-)i_H+I_R/2$. The source 15 of constant current at the same time produces the DC current $I_R/2$. The switch 5 which is located between the voltage/current converter 3 and the capacitor C reverses the polarity of the output signal of the voltage/current converter 3 synchronously with the periodic polarity change of the signal $u_H$, also in a periodic manner, so that the capacitor C constantly receives a current $(+/-)I_R/2+i_H$. The twice periodically polarity reversed signal $i_H$ which is proportional to $u_H$ is finally integrated in the capacitor C.

Due to the fact that the voltage/current converter 3 has as a rule a zero voltage $U_o$ at its input to which a proportional current $I_o$ corresponds at the output of the voltage/current converter 3, the input current of the switch 5 is actually not ideally equal to $(+/-)i_H+I_R/2$, but is equal to $(+/-)i_H+I_R/2+I_o$.

The value of the reference signal $I_R/2$ must meet the condition $I_R/2>|(+/-)i_H+I_o|$. In other words: the value of the constant reference signal $I_R/2$ should be greater than the value of the amplitude $i_H$ of the periodically polarity reversed signal $(+/-)i_H$ which is increased by the influence $I_o$ of the offset voltage.

The voltage/current converter 3 and the downstream capacitor C together constitute an integrator 3; C. The comparator 6 downstream of that integrator 3; C monitors its output voltage, i.e. the capacitor voltage $u_C$ for the purpose of controlling the switching on and off of the constant reference current $I_R$ supplied from the source 10 of constant current when a threshold value is exceeded or not attained, while at the same time producing rectangular output impulses. For the case that the $u_H$ signal is constant, the capacitor voltage $u_C$ takes a saw-tooth-shaped form, the positively and negatively functioning slopes of which are always parallel to each other.

The switch 9 controlled by the D-flipflop 7 serves to switch the reference current $I_R$ on and off. As has been mentioned earlier, the capacitor C is supplied a current $i_H(+/-)I_R/2$ $(+/-)I_o$ from the switch 5, where the plus sign refers to odd numbered and the minus sign to even numbered half periods of the switch-over signal A or B. When the output signal F of the D-flipflop 7 has an initial logic value "0", the switch 9 assumes initially the position as shown in FIG. 1. In this way the source 10 of constant current is always connected during the odd-numbered half-periods of the switch-over signal A or B, during which the switch 5 also assumes the position shown in FIG. 1 The reference current $I_R$ of the source 10 of constant current flows into the ground and cannot charge the capacitor C. During each odd-numbered half-period of the switch-over signal A or B the capacitor C is therefore charged only from the direction of switch 5 with the current $i_H+I_R/2 +I_o$. This causes the voltage $u_C$ to rise at the capacitor C. The comparator 6 has for example an input threshold value of 0 volt. If the voltage at the capacitor C exceeds the threshold value of the comparator 6, its output signal K changes its value from a logic value "0" to a logic value "1". The change of state of the output signal K is taken over with the next negative transition (i.e. trailing edge) of the high-frequency clocking signal L into the D-flipflop 7 downstream of the comparator 6. This flipflop serves to synchronize the rectangular output signal K of the comparator 6 with the rectangular clocking signal L whose frequency, as already stated, can be equal to $2^{10}$ Hz for example. The change in logic value of the D-flipflop 7 controls the switch 9 by means of its output signal F and switches it over so that it now assumes the opposite position of that shown in FIG. 1. This furthermore now causes the reference current $I_R$ of the source 10 of constant current to flow through the capacitor C.

The loading current of the capacitor C is thereby equal to $i_H+I_R/2+I_o-I_R=i_H-I_R/2+I_o$, i.e. the term $I_R/2$ has changed its sign. But since, as mentioned earlier, the condition $I_R/2>i_H+I_o|$ applies, the resulting charge current is negative.

The voltage at the capacitor C drops and, when it falls below the input threshold value of the comparator 6, its output signal K again assumes its original logic value "0". This change of value also is taken over into the D-flipflop 7 by the next negative transition of the clocking signal L, and this causes the switch 9 to assume its original position once more so that a new cycle can begin. This is repeated as many times as necessary until the odd-numbered half-period of the switch-over signal A or B is ended. Each impulse of the output signal F is thereby accompanied by one single discharge of the capacitor C effected by means of the reference current $I_R$.

At the end of each odd-numbered half period of the switch-over signal A or B the switches 1 and 5 are reversed synchronously by the switch-over signal A or B so that both of them assume the position opposite of that shown in FIG. 1. Due to the polarity-reversing action of the switch 5, the polarity of the capacitor C as well as of the influence of the source 10 of constant current is reversed. This time the source 10 of constant current, when the switch 9 is in the position shown in FIG. 1, is connected to both poles of the capacitor C and therefore is in operation. Under the assumption that the switch 9 assumes again the position shown in FIG. 1 for example at the beginning of the now starting, even-numbered half-period of the switch-over signal A or B, the capacitor C is charged with current $i_H-I_R/2-I_o$ coming from pole commutator 5 as well as with the reference current $I_R$ coming from the source 10 of constant current. The total charge current is therefore $i_H-I_R/2-I_o+I_R=i_H+I_R/2 -I_o$.

The voltage at the capacitor C increases and, when it exceeds the input threshold value of the comparator 6, its output signal K changes its value from logic value "0" to logic value "1". This change in value causes, in the manner described earlier, the switch 9 to switch over so that the source 10 of constant current is thereby connected to the grounded connection of the capacitor C. The capacitor is now only charged from the direction of the pole commutator 5 with the current $i_H-I_R/2-I_o$ which is negative since the condition $I_R/2>|(+/-)i_H+I_o|$ applies.

The capacitor voltage decreases and when it falls below the input threshold value of the comparator 6, the output signal K of the comparator changes its value back to the logic value "0", causing the switch 9 to be switched back into its starting position so that a new cycle can start. This is repeated until the even-numbered half-period of the switch-over signal A or B is ended.

In summary the following applies: During an odd-numbered half-period of the switch-over signal A or B the capacitor C is alternately charged with a current $i_H+I_R/2+I_o$ and discharged with a current $i_H-I_R/2+I_o$. During an even-numbered half period of the switch-over signal A or B capacitor C is alternately charged with a current $i_H+I_R/2-I_o$ and discharged with a current $i_H - I_R/2 - I_o$. The two types of half periods differentiate themselves from each other only through the sign of the current $I_o$. Since the switch-over signals A and B have half periods of exactly the same length due to the manner of their generation, and since the sign of the current $I_o$ is different in two consecutive half periods, $I_o$ and with it the influence of the offset voltage $U_o$ cancels itself out during an integration over a whole number of periods of the switch-over signal A or B.

The charge which arrives constantly to the capacitor C during each odd-numbered half period through current $i_H + I_R/2 + I_o$ from the direction of the switch 5, is at the same time continuously drained in small, constant, precisely defined charge quanta of size $Q_R = I_R/f_R$ through the added connection of the source 10 of constant current while a rectangular impulse per charge quantum is emitted at the Q output of the D-flip-flop 7. The charge which is constantly drained from the capacitor C during each even-numbered half period by the current $i_H - I_R/2 - I_o$ from the direction of the switch 5 is returned to it again continuously in small, constant, precisely defined charge quanta $Q_R$ by the added connection to the source 10 of constant current, so that the total charge current of the capacitor C is equal to the current $(i_H - I_R/2 - I_o) + I_R = i_H + I_R/2 - I_o$, where this time also a rectangular impulse per quantum is emitted at the same time at the Q output of the D flipflop 7. Each of these impulses is thus a measure for the small, precisely defined charge quantum which is withdrawn from or supplied to the capacitor C by means of the reference current: $I_R$. Due to the polarity reversal of the capacitor C, the polarity of the charge current $(+/-)I_o + i_H + I_R/2$ remains unchanged and thus the residual charge still remaining in the capacitor C at the time of the periodic polarity reversal is taken into consideration with the correct polarity during the following half-period so that no modulation of the output frequency caused by the residual charge can occur.

The output signal F of the D-flipflop 7 produced by means of the integration and of the comparator 6 comprises rectangular impulses. The median frequency $f_F$ of these impulses is proportional to the compound current $i_H + I_R/2$ and thus too great by one constant frequency $f_R/2$, $f_R/2$ being the frequency which corresponding to the value of the reference signal $I_R/2$. The frequency $f_R/2$ is also the frequency of the rectangular impulses of the clocking signal P. In order to obtain an output frequency of the arrangement according to invention which is only proportional to the signal current $i_H$ and is thereby also only proportional to the signal $u_H$, the constant reference frequency $f_R/2$ of the clocking signal P must therefore be subtracted from the frequency $f_F$ of the output signal F. This is done by means of an up-/down counter in form of the output frequency divider 8 at the output of the arrangement by counting the impulses of the output signal F of the D-flipflop 7 at that point upward and those of the clocking signal P downward. At the same time the output frequency divider 8 divides this frequency difference by a number k.

Figure 3:
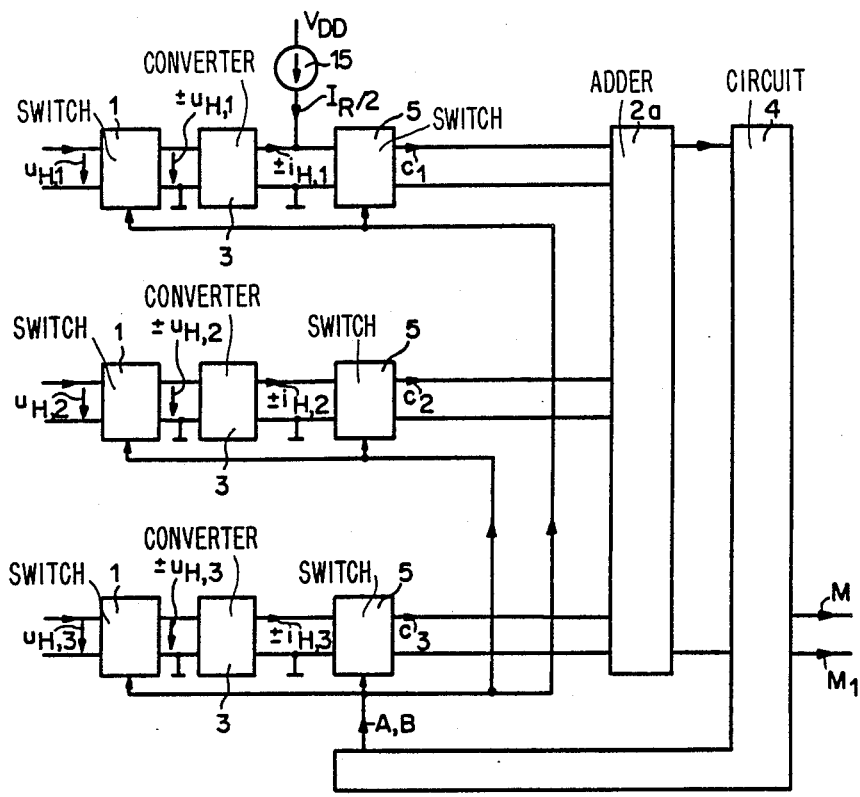
FIG. 3 shows a block diagram of a second embodiment of the arrangement according to the invention for converting a multiphase signal into a frequency.
Figure 4:
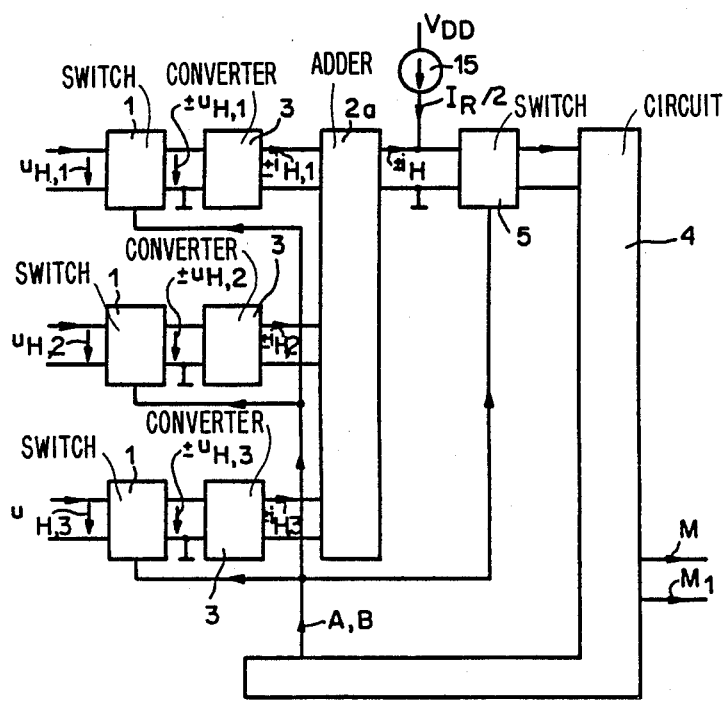
FIG. 4 shows a block diagram of a third embodiment of the arrangement according to the invention for converting a multiphase signal into a frequency.

The arrangement according to the present invention is now considered in detail. Three single-phase signals $u_{H,1}$, $u_{H,2}$, and $u_{H,3}$, which supply one input of each switch 1 in all three embodiments of the arrangement according to the invention as shown in FIGS. 2 to 4, constitute together the multiphase signal $u_{H,1}$, $u_{H,2}$, and $u_{H,3}$, for example which is to be converted. Thus one polarity reversing switch 1 per phase is provided in all three embodiments Furthermore each embodiment is provided with an adder circuit 2 which has a two-pole output and as many two-pole or one-pole inputs as there are phases. In FIGS. 2 to 4 three two-pole inputs of the adder circuit 2 are thus provided. The frequency into which the multiphase signal $u_{H,1}$, $u_{H,2}$ and $u_{H,3}$, is to be converted is proportional to the sum of the single phase signals $u_{H,1}$, $u_{H,2}$, and $u_{H,3}$. All the components 1, 3, 4, 5 and 15 shown in FIGS. 2 to 4 are identical in structure to the components of FIG. 1 bearing the same reference numbers. In all three embodiments at least one voltage/current converter 3 downstream of the switch 1, at least one second polarity reversing switch 5 downstream of the voltage/current converter 3, one source 15 of constant current and the circuit 4 are always provided in addition. Circuit 4 always contains a control circuit 13; 14 or 11; 12 to produce at least one periodic switch-over signal A or B for the polarity reversing switches 1 and 5. Each constant current source 15 serves to produce a reference current $I_R/2$. A constant current source 15 is provided at the input of the switch 5 (FIGS. 2, 4) or of one of the switches 5 (FIG. 3). Each second polarity reversing switch 5 is controlled by the same switch-over signal A or B as at least one corresponding first polarity reversing switch 1.

In the first embodiment of the arrangement according to the invention shown in FIG. 2 the output of each first polarity reversing switch 1 is connected to one of the three two-pole inputs of the circuit 2. The adder circuit 2, a voltage/current converter 3, a second polarity reversing switch 5 and a circuit 4 are connected in series in the sequence indicated. Furthermore a constant current source 15 is provided, the first pole of which is connected to a non-grounded output pole of the voltage/current converter 3, while its second pole is connected to the positive DC supply voltage $V_{DD}$. One input pole of the voltage/current converter 3 and one input pole of the switch 5 is grounded. The control inputs of the switches 1 and 5 are all interconnected and are supplied with a switch-over signal A or B from circuit 4, exactly as in FIG. 1.

The arrangement shown in FIG. 2 functions in a similar manner as the arrangement shown in FIG. 1, with the difference that all three single phase signals $u_{H,1}$, $u_{H,2}$, and $u_{H,3}$ are polarity reversed periodically and synchronously in relation to each other by one polarity reversing switch 1 for each and that the polarity reversed signals $(+/-)u_{H,1}$, $(+/-)u_{H,2}$ and $(+/-)u_{H,3}$ at the outputs of the polarity reversing switches 1 are first added together by the adder circuit 2 before the resultant signal feeds the input of the voltage/current converter 3 in form of a voltage $(+/-)u_H$. Subsequently this resultant signal is prepared and processed in the arrangement of FIG. 2 exactly as the input signal $(+/-)u_H$ of the voltage/current converter 3 of the arrangement shown in FIG. 1. The output frequency of the circuit 4 is then proportional to the sum of the phases forming the multiphase signal. The condition $I_R/2 > |(+/-)i_H + I_o|$ applies also to the arrangement shown in FIG. 2.

In the second embodiment of the arrangement shown in FIG. 3 one voltage/current converter 3 and one second polarity reversing switch 5 is provided for each first polarity reversing switch 1 and thereby for each phase. A first polarity reversing switch 1, a voltage/current converter 3 and a second polarity reversing switch 5 for each phase are connected in series in the order indicated. The two-pole output of each of these series connections 1: 3: 5 is connected to one of the three two-pole inputs of an adder circuit 2a. The adder circuit 2a and a circuit 4 are connected in series in the sequence indicated. Furthermore a constant current source 15 is provided, the first pole of which is connected to a non-grounded output pole of one of the three voltage/current converters 3 while its second pole is carried to the positive DC supply voltage $V_{DD}$. One input pole of each of the voltage/current converters 3 and one pole of each of the second polarity reversing switches 5 is grounded. The control inputs of all the polarity reversing switches 1 and 5 are connected to each other and are supplied from circuit 4 with a switch-over signal A, B.

The arrangement shown in FIG. 3 functions similarly to the arrangement shown in FIG. 1, with the difference that all three single-phase signals $u_{H,1}$, $u_{H,2}$ and $u_{H,3}$, are each treated by a series connection 1; 3; 5 in the same manner as the input signal $u_H$ of the arrangement shown in FIG. 1 is treated by the series connection 1; 3; 5 of that embodiment. The output signals $c_1$, $c_2$ and $c_3$ of the series connections 1; 3; 5 are added together in the adder circuit 2a and the resultant signal thus obtained is applied subsequently the input of the circuit 4. This resultant signal is processed and treated subsequently in circuit 4 of FIG. 2 exactly as the input signal of circuit 4 of the arrangement shown in FIG. 1. The output frequency of circuit 4 in the second embodiment is then proportional to the resultant signal. For the arrangement shown in FIG. 3 the following conditions apply: $I_R > |c_1 + c_2 + c_3|$ and $I_R/2 > |(+/-)i_{H,1} + (+/-)i_{H,2} + (+/-)i_{H,3} + I_{o,1} + I_{o,2} + I_{o,3}|$, where $(+/-)i_{H,1}$, $(+/-)i_{H,2}$ and $(+/-)i_{H,3}$ represent the three active currents at the outputs of the three voltage/current converters 3 and $I_{o,1}$, $I_{o,2}$ and $I_{o,3}$ are the three output currents of the voltage/current converters 3 which are proportional to the three offset voltages $U_{o,1}$, $U_{o,2}$, and $U_{o,3}$, of the voltage/current converters 3.

In the third embodiment of the arrangement shown in FIG. 4 one voltage/current converter 3 is provided for each first polarity reversing switch 1 and thereby for each phase. The first polarity reversing switches 1 and voltage/current converters 3 are in series connection in the sequence indicated in FIG. 4. The two-pole output of each of these series connections 1; 3 is connected to one of the three two-pole inputs of an adder circuit 2a. The adder circuit 2a, a second polarity reversing switch 5 and a circuit 4 are connected in series in the sequence shown. Furthermore a constant current source 15 is provided, the first pole of which is connected to a non-grounded output pole of the adder circuit 2a while its second pole is connected to the positive DC supply voltage $V_{DD}$. One input pole of each of the voltage/current converters 3 and one input pole of each of the polarity reversing switches 5 is grounded. The control inputs of the polarity reversing switches 1 and 5 are all connected to each other and are supplied from circuit 4 with a switch-over signal A or B exactly as in FIG. 1.

The arrangement shown in FIG. 4 functions similarly to the arrangement shown in FIG. 1, with the difference that all three single phase signals $u_{H,1}$, $u_{H,2}$, and $u_{H,3}$, are each treated by a series connection 1; 3 as the input signal $u_H$ in the arrangement shown in FIG. 1 is treated by the series connection 1; 3 in that arrangement. The output signals of the three series connections 1; 3 each supply one of the three two-pole inputs of the adder circuit 2a in which they are added. Thereafter this resultant signal $(+/-)i_H$ in the arrangement of FIG. 4 is processed and treated thereafter exactly as the output signal $(+/-)i_H$ of the voltage/current converter 3 of the arrangement shown in FIG. 1. The output frequency of the circuit 4 in the third arrangement is then proportional to the resultant signal. In the arrangement shown in FIG. 4, the following condition applies: $I_R/2 > |(+/-)i_{H,1} + (+/-)i_{H,2} + (+/-)i_{H,3} + I_{o,1} + I_{o,2} + I_{o,3}|$.

Figure 5:
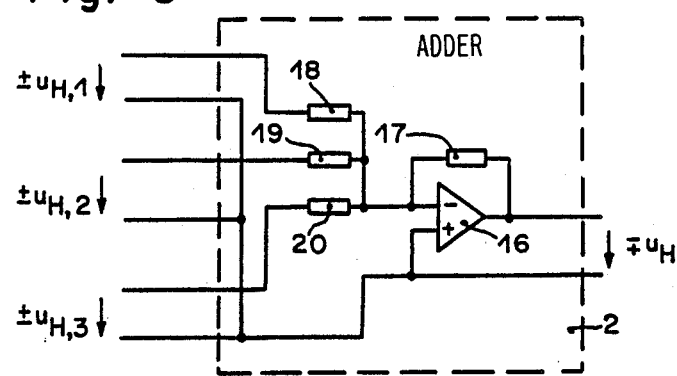
FIG. 5 shows a diagram of an adder circuit for use in the arrangement of FIG. 2.

The adder circuit 2 shown in FIG. 5 comprises an operational amplifier 16, the output of which is connected via a resistance 17 to its inverting input and to a common pole of three resistors 18, 19 and 20 connected to each other in the form of a star. Each of the other poles of the three resistors 18 to 20 constitutes a first pole of the three inputs of the adder circuit 2. The second pole of these inputs are connected to each other and to a non-inverting input of the operational amplifier 16 as well as to a pole of the two-pole output of the adder circuit 2. The output of the operational amplifier 16 constitutes in turn the second pole of that output.

Figure 6:
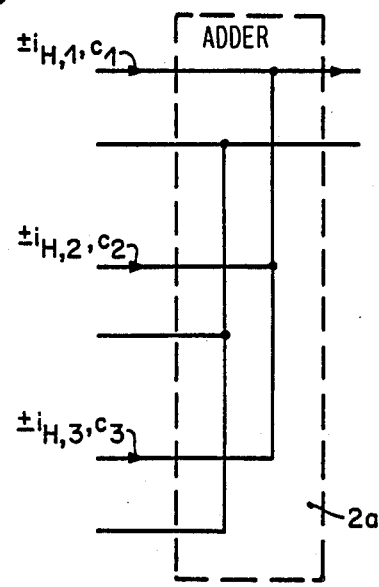
FIG. 6 shows a diagram of an adder circuit for use in the arrangement of FIGS. 3 and 4.

The adder circuit 2a shown in FIG. 6 comprises a wiring arrangement in which all first poles of the three two-pole inputs of the adder circuit 2a are connected among each other and to a first pole of the two-pole output of the adder circuit 2a. Similarly all second poles of these inputs and the second pole of this output are connected to each other.

Finally, the above-described embodiments are intended to be illustrative only. Numerous alternative embodiments may be devised by those skilled in the art without departing from the spirit and scope of the following claims.

We claim:

1. An arrangement for converting a multiphase electric signal into a frequency comprising:
   an adder circuit for adding the phases comprising said multiphase signal,
   one first polarity reversing switch for each phase in said multiphase signal,
   at least one voltage/current converter connected downstream of said first polarity reversing switches,
   at least one second polarity reversing switch connected downstream of said voltage/current converter,
   a control circuit for generating a periodic switch-over signal for controlling said first and second polarity reversing switches, and
   a constant current source connected at an input of said one second polarity reversing switch.

2. The arrangement of claim 1, wherein an output of each of said first polarity reversing switches is connected to an input of said adder circuit, wherein said voltage/current converter is connected at an output of said adder circuit, and wherein said one second polarity reversing switch is connected at an output of said voltage/current converter.

3. The arrangement of claim 1 wherein said arrangement further comprises one voltage/current converter connected to each of said first polarity reversing switches and one second polarity reversing switch connected to each voltage/current converter, an output of each second polarity reversing switch being connected to said adder circuit.

4. The arrangement of claim 1 wherein one voltage/current converter is connected to each of said first polarity reversing switches, wherein an output of each voltage/current converter is connected to an input of said adder circuit and in that said one second polarity reversing switch is connected to an output of said adder circuit.

* * * * *